(12) United States Patent
Park

(10) Patent No.: US 9,653,139 B1
(45) Date of Patent: May 16, 2017

(54) SIMULTANEOUS PLURAL WORDLINE WITHIN A BANK REFRESHING CONTROL DEVICE AND MEMORY DEVICE INCLUDING THE SAME

(71) Applicant: SK hynix Inc., Icheon-si Gyeonggi-do (KR)

(72) Inventor: So Min Park, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/205,041

(22) Filed: Jul. 8, 2016

(30) Foreign Application Priority Data

Apr. 1, 2016 (KR) .......................... 10-2016-0040393

(51) Int. Cl.
*G11C 11/402* (2006.01)
*G11C 11/406* (2006.01)
*G11C 11/408* (2006.01)

(52) U.S. Cl.
CPC ........ *G11C 11/402* (2013.01); *G11C 11/4087* (2013.01); *G11C 11/40615* (2013.01); *G11C 11/406* (2013.01)

(58) Field of Classification Search
CPC .................... G11C 11/40615; G11C 11/4087
See application file for complete search history.

(56) References Cited

U.S. PATENT DOCUMENTS

| 5,373,475 | A | * | 12/1994 | Nagase | G11C 11/406 365/222 |
| 2002/0001246 | A1 | * | 1/2002 | Hidaka | G11C 11/406 365/222 |
| 2002/0181308 | A1 | * | 12/2002 | Shimoyama | G11C 11/406 365/222 |
| 2006/0133182 | A1 | * | 6/2006 | You | G11C 7/02 365/230.03 |
| 2013/0272082 | A1 | * | 10/2013 | Kim | G11C 11/402 365/203 |

FOREIGN PATENT DOCUMENTS

| KR | 101102051 B1 | 12/2011 |
| KR | 1020110131634 A | 12/2011 |
| KR | 1020140080305 A | 6/2014 |

* cited by examiner

*Primary Examiner* — Harry W Bryne
*Assistant Examiner* — Ajay Ojha
(74) *Attorney, Agent, or Firm* — William Park & Associates Ltd.

(57) ABSTRACT

A refresh control device and a semiconductor device including the same, for preventing a row hammer failure from occurring, may include an enable signal generator configured to generate an enable signal for performing a smart refresh operation and a plurality of active controllers configured to generate a plurality of refresh signals for refreshing word lines located at different positions within one bank, based on receiving the enable signal.

18 Claims, 8 Drawing Sheets

SIMULTANEOUS PLURAL WORDLINE WITHIN A BANK REFRESHING CONTROL DEVICE AND MEMORY DEVICE INCLUDING THE SAME

CROSS-REFERENCE TO RELATED APPLICATION

This application claims priority based upon Korean patent application No. 10-2016-0040393, filed on Apr. 1, 2016, the disclosure of which is hereby incorporated in its entirety by reference herein.

BACKGROUND

1. Technical Field

Embodiments of the present disclosure generally relate to a refresh control device and a semiconductor device including the same, and more particularly to a refresh control device and/or refresh controller.

2. Related Art

With increasing integration of semiconductor memory devices, a distance between a plurality of word lines contained in the semiconductor memory device has been gradually reduced, resulting in an increased coupling effect between contiguous word lines.

Word lines are toggled from an active state to an inactive state and from the inactive state to the active state whenever data is input and output to and from memory cells. However, with the increased coupling effect between contiguous word lines, data of memory cells coupled to word lines contiguous to frequently activated word lines is unavoidably damaged or lost.

The above data damage phenomenon is referred to as word line disturbance. Due to the occurrence of such word line disturbance, data stored in the memory cells may be damaged or lost before each of the memory cells are refreshed.

SUMMARY

In accordance with an embodiment of the present disclosure, a refresh control device may be provided. The refresh control device may include an enable signal generator configured to generate an enable signal for performing a smart refresh operation. The refresh control device may include a plurality of active controllers configured to generate a plurality of refresh signals for refreshing word lines located at different positions within one bank, based on receiving the enable signal.

In accordance with an embodiment of the present disclosure, a semiconductor device may be provided. The semiconductor device may include a bank including a plurality of groups divided on a basis of a specific unit in a manner that word lines of different addresses classified according to respective groups may be refreshed based on a refresh signal. The semiconductor device may include a refresh controller configured to generate an enable signal for performing a smart refresh operation, and a refresh signal for performing a refresh operation on a basis of the plurality of groups based on a refresh address.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a refresh control device and a semiconductor device including the same that substantially obviate one or more problems due to limitations and disadvantages of the related art.

An embodiment of the present disclosure may relate to a refresh control device and a semiconductor device including the same, which refresh different addresses on the basis of a specific unit of each bank, and may, thus, prevent occurrence of a failed (or defective) part caused by the row hammer phenomenon.

Figure 1:
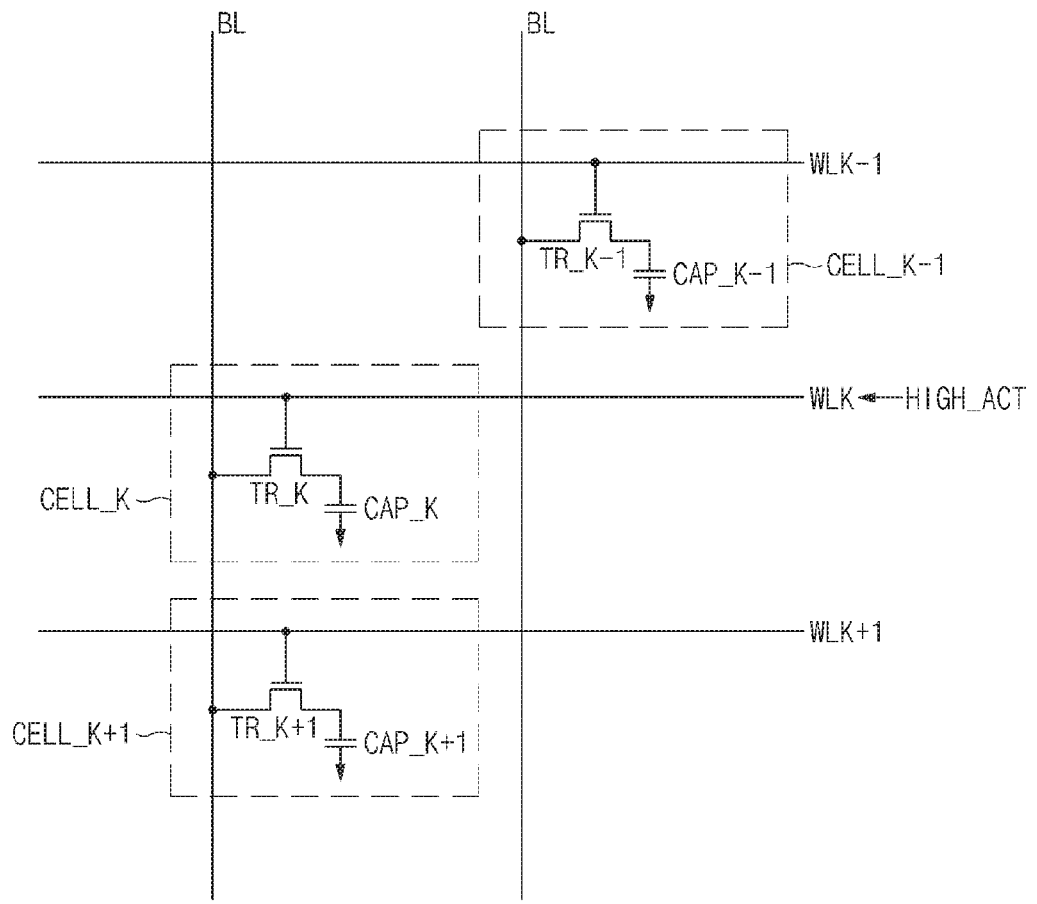
FIG. 1 is a circuit diagram illustrating a representation of an example of some parts of a cell array contained in a memory device to explain the word line disturbance phenomenon.

FIG. 1 is a circuit diagram illustrating some parts of a cell array contained in a memory device to explain the word line disturbance phenomenon.

Referring to FIG. 1, 'WLK' may refer to a word line having a large number of activation times, and 'WLK−1' and 'WLK+1' may refer to contiguous word lines located adjacent to the word line 'WLK'. 'CELL_K' may refer to a memory cell coupled to the word line 'WLK', 'CELL_K−1' may refer to a memory cell coupled to the contiguous word line 'WLK−1', and 'CELL_K+1' may refer to a memory cell coupled to the other contiguous word line 'WLK+1'. A first memory cell may include a cell transistor TR_K and a cell capacitor CAP_K, a second memory cell may include a cell transistor TR_K−1 and a cell capacitor CAP_K−1, and a third memory cell may include a cell transistor TR_K+1 and a cell capacitor CAP_K+1.

Referring to FIG. 1, if the word line 'WLK' is activated or deactivated, the voltages of the contiguous word lines (WLK−1, WLK+1) are increased or reduced due to occurrence of the coupling effect between one word line WLK and the contiguous word lines (WLK−1, WLK+1), such that the amount of charges of the memory cells (CELL_K−1, CELL_K+1) may be affected.

Therefore, if the word line WLK is toggled between an active state and an inactive state because the word line WLK is frequently activated, the amount of charges stored in cell capacitors (CAP_K−1, CAP_K+1) contained in the memory cells (CELL_K−1, CELL_K+1) may be greatly changed, and data of each memory cell may be deteriorated.

Electromagnetic waves generated when the word line is toggled between the active state and the inactive state may allow electrons to be introduced into a cell capacitor of a memory cell coupled to a contiguous word line or may allow electrons to be discharged from the cell capacitor, such that data is damaged or lost.

A specific word line (e.g., WLK) repeatedly activated at least a predetermined number of times such that data of memory cells coupled to the contiguous word lines (e.g., WLK+1, WLK−1) may deteriorate. This data deterioration phenomenon will hereinafter be referred to as the row hammer phenomenon. A representative example for addressing this issue is to activate contiguous word lines (WLK+1, WLK−1) located adjacent to the excessively activated word line WLK.

Since the contiguous word lines (WLK+1, WLK−1) are activated, data of memory cells coupled to the contiguous word lines (WLK+1, WLK−1) is rewritten and prevented from being damaged or lost.

Generally, a semiconductor device such as a DRAM may include a large number of memory cells, and each memory cell may include a transistor acting as a switch and a capacitor storing data therein. However, since a leakage current occurs due to a memory cell structure such as a PN junction of a transistor, initial data stored in the capacitor may disappear. Therefore, a refresh operation for recharging data in memory cells prior to data disappearance may be needed.

A normal refresh operation may be classified into an auto-refresh mode, a self-refresh mode, etc. During the auto-refresh mode, the semiconductor device performs a refresh operation upon receiving a refresh command from an external part. During the self-refresh mode, the semiconductor device performs a refresh operation while simultaneously and sequentially changing internal addresses according to a refresh command received from the external part.

In addition to execution of the normal refresh operation, the semiconductor device further performs an additional refresh operation for a row having a high possibility of losing data due to the occurrence of the row hammer phenomenon.

The row hammer phenomenon may indicate that data of memory cells coupled to the corresponding row or contiguous rows thereof is damaged or lost due to a high number of activation times. In other words, only one word line for each bank stores an address of an activated word line therein. The semiconductor device performs the refresh operation to solve row hammer occurring in one word line for each bank.

As the degree shrinkage increases in the technology of semiconductor devices, an effective value of the row hammer is gradually deteriorated, and the refresh operation for solving the row hammer should be carried out more frequently than in the conventional art. However, assuming that the refresh operation is frequently performed, unexpected time restrictions may occur.

As a result, the semiconductor device according to an embodiment of the present disclosure controls different addresses to be refreshed according to a specific unit for each bank, and thus may prevent occurrence of a failed or defective part caused by the row hammer phenomenon. That is, the semiconductor device may store word lines to be activated, may control addresses stored according to a specific unit during a smart refresh operation, and thus may simultaneously refresh the corresponding word lines.

Figure 2:
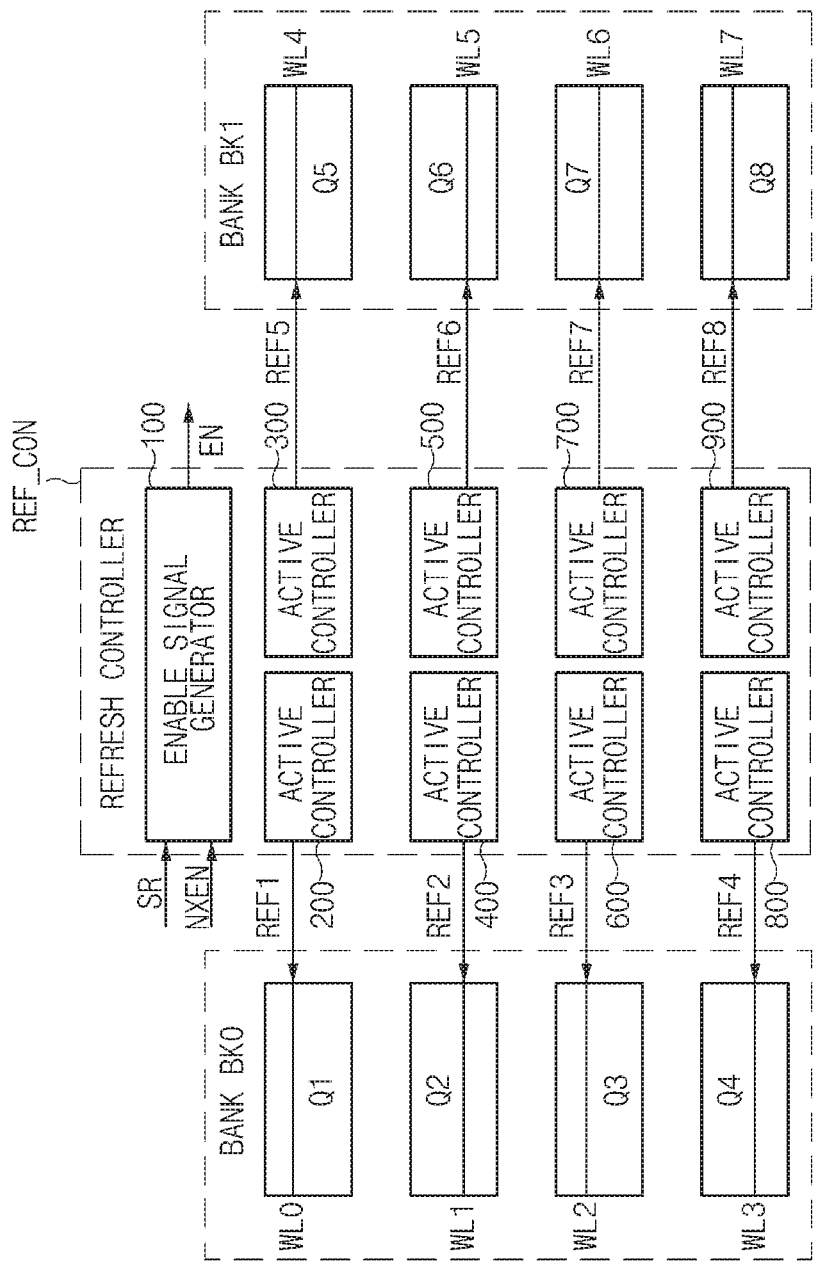
FIG. 2 is a block diagram illustrating a representation of an example of a semiconductor device including a refresh control device according to an embodiment of the present disclosure.

FIG. 2 is a block diagram illustrating a representation of an example of a semiconductor device including a refresh control device according to an embodiment of the present disclosure.

Referring to FIG. 2, a semiconductor device may include banks (BK0, BK1) and a refresh controller REF_CON.

Referring to FIG. 2, the bank BK0 may include a plurality of groups Q1~Q4 classified according to a specific unit. In other words, the bank BK0 may be classified into a plurality of groups Q1~Q4, such that word lines WL of different addresses are refreshed.

For example, the bank BK0 may be divided into four groups Q1~Q4 (for example, a quarter basis or 8K basis). In the groups Q1~Q4, word lines WL located at different positions may be refreshed.

For example, in the group Q1, the word line WL0 may be enabled in response to a refresh signal REF1. In the group Q2, the word line WL1 may be enabled in response to a refresh signal REF2. In the group Q3, the word line WL2 may be enabled in response to a refresh signal REF3. In the group Q4, the word line WL3 may be enabled in response to a refresh signal REF4.

The bank BK1 may include a plurality of groups Q5~Q8 divided according to a specific unit. The bank BK1 may be divided into a plurality of groups Q5~Q8, such that word lines of different addresses are refreshed.

For example, the bank BK1 may be divided into four groups Q5~Q8 (for example, a quarter basis or 8K basis). In the groups Q5~Q8, word lines WL located at different positions may be refreshed.

For example, in the group Q5, the word line WL4 may be enabled in response to a refresh signal REF5. In the group Q6, the word line WL5 may be enabled in response to a refresh signal REF6. In the group Q7, the word line WL6 may be enabled in response to a refresh signal REF7. In the group Q8, the word line WL7 may be enabled in response to a refresh signal REF8.

Although, for example, an embodiment has disclosed two banks (BK0, BK1) for convenience of description, the number of banks is not limited thereto.

The refresh controller REF_CON may generate refresh signals REF1~REF8 to refresh different word lines WL0~WL7 according to individual groups Q1~Q8. The refresh controller REF_CON may be formed in an X-hole region disposed between banks (BK0, BK1).

The refresh controller REF_CON may include an enable signal generator 100 and a plurality of active controllers 200~900.

The enable signal generator 100 may generate an enable signal for performing the smart refresh operation, and may output the generated enable signal to respective active controllers 200~900.

The active controllers 200~900 may respectively generate refresh signals REF1~REF8 for performing the refresh operations of respective groups Q1~Q8 in response to an enable signal, a refresh address, and a control signal.

Input and output (Input/output) (I/O) signals and addresses of the refresh controller REF_CON will hereinafter be described with reference to FIGS. 3 to 7.

In an embodiment, a single enable generator 100 may be provided, for example, for every two banks (BK0, BK1). The number of active controllers 200~900 may be identical to the number of groups Q1~Q8. However, the number of enable generators 100 and the number of active controllers 200~900 are not limited thereto, and can also be changed without departing from the scope or spirit of the present disclosure.

First, the refresh operation will hereinafter be described. The refresh operation may be largely classified into two kinds of refresh operations, i.e., a normal refresh operation and a smart refresh operation. The normal refresh operation may refer to a refresh operation which is carried out according to a normal refresh command such as a self-refresh command or an auto-refresh command. The smart refresh operation may refer to a refresh operation for a specific word line.

The smart refresh operation will hereinafter be described.

Generally, word lines may be activated or deactivated through an active operation. However, assuming that the active operation is continuously carried out in the same word line, disturbance may occur in a contiguous word line neighboring the activated word line. For example, since the distance between word lines is gradually reduced in proportion to increasing integration of semiconductor devices, such disturbance may occur in the contiguous word line.

Therefore, a voltage level of the contiguous word line of the activated word line may become unstable, such that data stored in each memory cell coupled to the contiguous word line may easily be damaged or lost.

As a result, the semiconductor device according to an embodiment may perform the refresh operation of different specific word lines according to respective groups Q1~Q8 to prevent data from being damaged or lost. For convenience of description, the above-mentioned refresh operation will hereinafter be referred to as a smart refresh operation.

Figure 3:
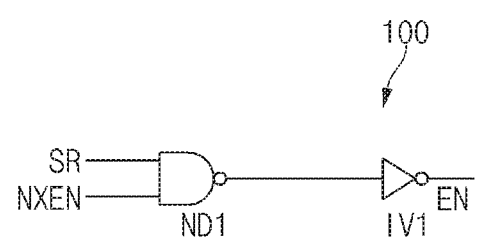
FIG. 3 is a circuit diagram illustrating a representation of an example of an enable signal generation circuit illustrated in FIG. 2.

FIG. 3 is a circuit diagram illustrating a representation of an example of the enable signal generator 100 illustrated in FIG. 2.

Referring to FIG. 3, the enable signal generator 100 may generate an enable signal EN by combining a smart refresh signal SR and a normal enable signal NXEN.

Assuming that the smart refresh signal SR and the normal enable signal NXEN are activated, the enable signal generator 100 may activate the enable signal EN. Assuming that any one of the smart refresh signal SR and the normal enable signal NXEN is deactivated, the enable signal generator 100 may deactivate the enable signal EN.

The enable signal generator 100 may include logic gates, for example, a NAND gate ND1 and an inverter IV1. The NAND gate ND1 may perform a logic NAND operation between the smart refresh signal SR and the normal enable signal NXEN. The inverter IV1 may output the enable signal EN by inverting an output signal of the NAND gate ND1.

Figure 4:
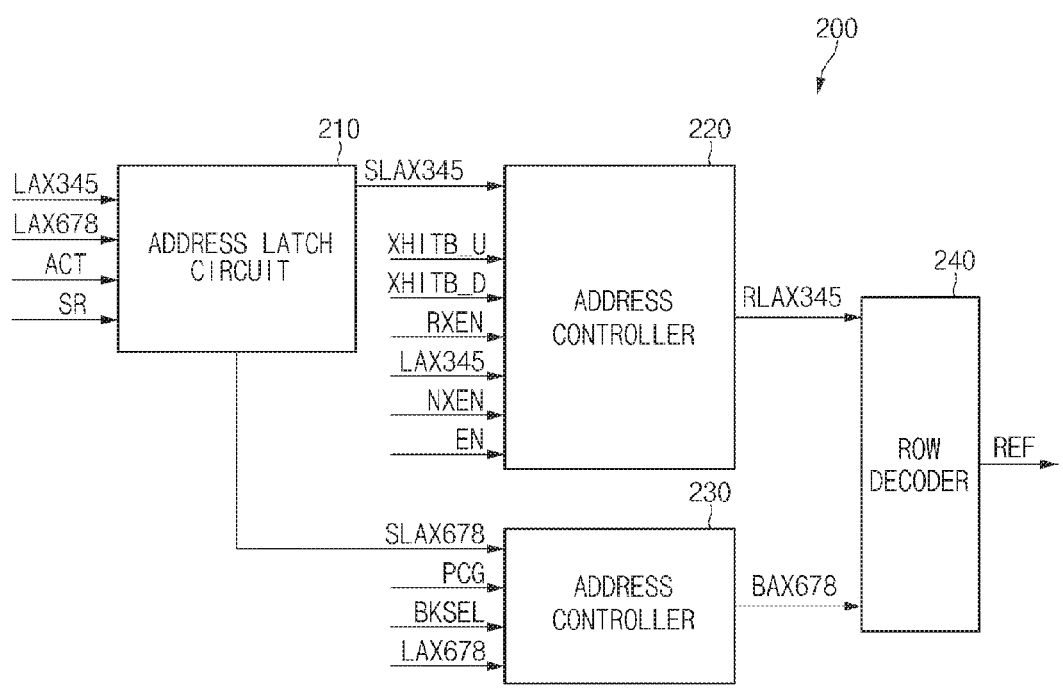
FIG. 4 is a circuit diagram illustrating a representation of an example of an active controller illustrated in FIG. 2.

FIG. 4 is a circuit diagram illustrating a representation of an example of an active controller (i.e., 200~900) illustrated in FIG. 2. For convenience of description and better understanding of the present disclosure, the active controller 200 from among the plurality of active controllers 200~900 will hereinafter be described with reference to the attached drawings.

The active controller 200 may include an address latch circuit 210, address controllers (220, 230), and a row decoder 240.

Prior to execution of the smart refresh operation, the address latch circuit 210 may latch an address corresponding to an activated word line according to respective banks (BK0, BK1). For example, the bank BK0 includes four groups Q1~Q4, and the bank BK1 includes four groups Q5~Q8. The address latch circuit 210 may latch addresses (LAX345, LAX678) in response to the smart refresh signal SR and the active signal ACT, and may output refresh addresses (SLAX345, SLAX678).

In this case, the addresses (LAX345, LAX678) may correspond to addresses that are decoded to smart-refresh different word lines according to respective banks (BK0, BK1). For example, the bank BK0 includes four groups Q1~Q4, and the bank BK1 includes four groups Q5~Q8.

The address controller 220 may output an address control signal RLAX345, upon receiving a refresh address SLAX345, heating signals (XHITB_U, XHIT_D), a repair enable signal RXEN, an address LAX345, a normal enable signal NXEN, and an enable signal EN.

The address controller 230 may output an address control signal BAX678, upon receiving a refresh address SLAX678, a precharge signal PCG, a bank selection signal BKSEL, and an address LAX678.

The row decoder 240 may decode an address control signal RLAX345 and the other address control signal BAX678. The row decoder 240 may output a refresh signal REF for refreshing different word lines of respective banks (BK0, BK1) to the respective banks (BK0, BK1).

Figure 5:
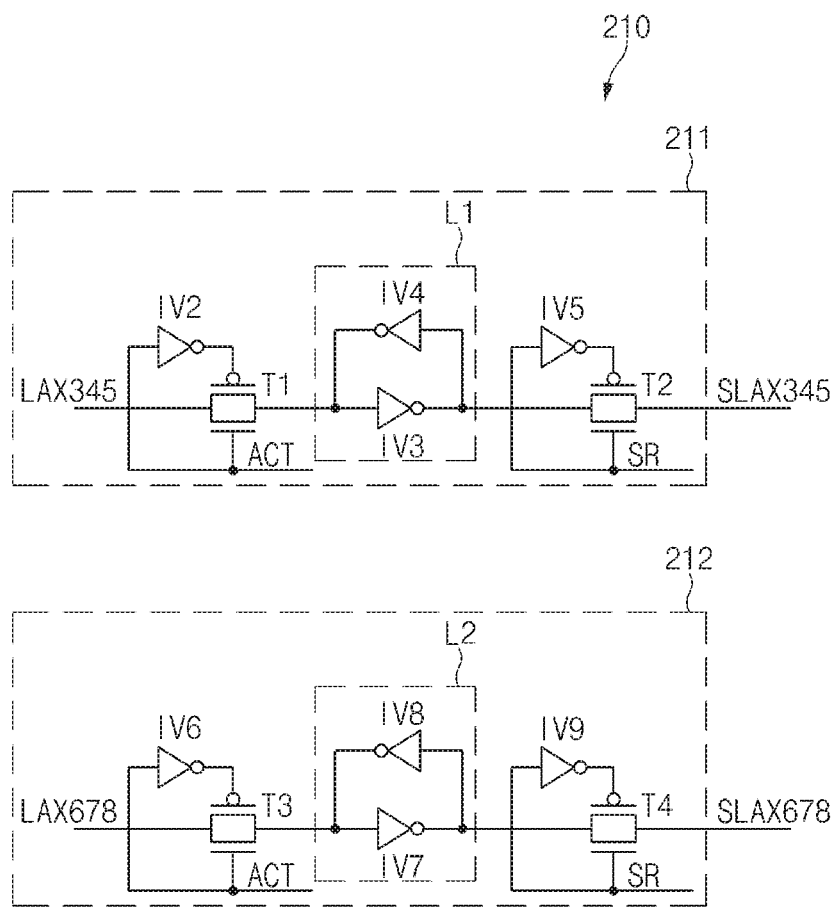
FIG. 5 is a circuit diagram illustrating a representation of an example of an address latch circuit illustrated in FIG. 4.

FIG. 5 is a circuit diagram illustrating a representation of an example of the address latch circuit 210 illustrated in FIG. 4.

Referring to FIG. 5, the address latch circuit 210 may include a first latch circuit 211 and a second latch circuit 212. The address latch circuit 210 may respectively store addresses activated by the active operation in the first and second latch circuits (211, 212) according to individual banks (BK0, BK1). For example, the bank BK0 includes four groups Q1~Q4, and the bank BK1 includes four groups Q5~Q8.

The latch circuit 211 may latch the address LAX345 in response to the smart refresh signal SR and the active signal ACT, and may output the refresh address SLAX345. The latch circuit 212 may latch the address LAX678 in response to the smart refresh signal SR and the active signal ACT, and may output the refresh address SLAX678.

The latch circuit 211 may include transfer gates (T1, T2), inverters (IV2, IV5), and a latch L1. For example, the transfer gate T1 may selectively output the address LAX345 in response to the active signal ACT and the other active signal ACT inverted by the inverter IV2.

For example, if the active signal ACT is at a high level, the transfer gate T1 may output the address LAX345 to the latch L1.

If the active signal ACT is at a low level, the transfer gate T1 may not transmit the address LAX345 to the latch L1. The latch L1 may include inverters (IV3, IV4), input/output (I/O) terminals of which are interconnected, and may thus latch an output signal of the transfer gate T1.

The transfer gate T2 may output the output signal of the latch L1 as the refresh address SLAX345 in response to the smart refresh signal SR and the other smart refresh signal SR inverted by the inverter IV5.

For example, if the smart refresh signal SR is at a high level, the transfer gate T2 may output the output signal of the latch L1 as the refresh address SLAX345. If the smart refresh signal SR is at a low level, the transfer gate T2 may not output the refresh address SLAX345.

The latch unit 212 may include transfer gates (T3, T4), inverters (IV6, IV9), and a latch L2. The transfer gate T3 may selectively output the address LAX678 in response to the active signal ACT and the other active signal ACT inverted by the inverter IV6.

For example, if the active signal ACT is at a high level, the transfer gate T3 may output the address LAX678 to the latch L2. If the active signal ACT is at a low level, the transfer gate T3 may not transmit the address LAX678 to the latch L2. The latch L2 may include inverters (IV7, IV8), input/output (I/O) terminals of which are interconnected, and may thus latch an output signal of the transfer gate T3.

The transfer gate T4 may output the output signal of the latch L2 as the refresh address SLAX678 in response to the smart refresh signal SR and the other smart refresh signal SR inverted by the inverter IV9.

For example, if the smart refresh signal SR is at a high level, the transfer gate T4 may output the output signal of the latch L2 as the refresh address SLAX678. If the smart refresh signal SR is at a low level, the transfer gate T4 may not output the refresh address SLAX678.

As described above, the address latch circuit 210 may latch an address for each of the groups Q1~Q4 of the bank BK0, upon receiving the active signal ACT during the active operation.

For example, when the active signal ACT is activated, the address LAX345 may be stored in the latch L1. When the smart refresh signal SR is activated and the address LAX345 is at a low level, the address stored in the latch L1 may be output as the refresh address SLAX345.

If the active signal ACT is activated, the address LAX678 may be stored in the latch L2. Assuming that the smart refresh signal SR is activated and the address LAX678 is at a low level, the address stored in the latch L2 may be output as the refresh address SLAX678.

Figure 6:
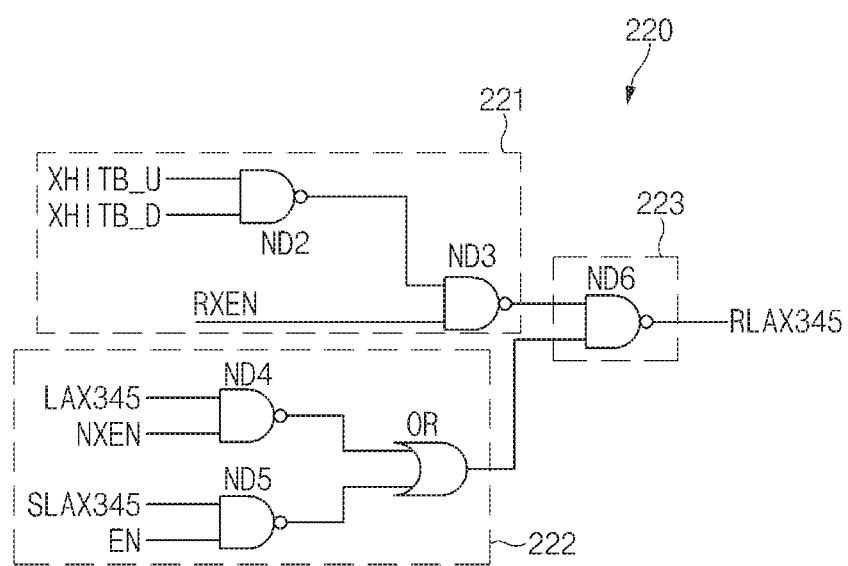
FIGS. 6 and 7 are circuit diagrams illustrating representations of examples of an address controller illustrated in FIG. 4.

FIG. 6 is a circuit diagram illustrating a representation of an example of the address controller 220 illustrated in FIG. 4.

Referring to FIG. 6, the address controller 220 may generate the address control signal RLAX345, upon receiving the heating signals (XHITB_U, XHIT_D), the repair enable signal RXEN, the address LAX345, the normal enable signal NXEN, the refresh address SLAX345, and the enable signal EN.

The address controller 220 may include a repair address controller 221, a normal address controller 222, and a combination circuit 223.

For example, during the repair mode, the repair address controller 221 may combine the heating signals (XHITB_U, XHIT_D) and the repair enable signal RXEN, and may output the combined resultant signal. If the repair region is divided into an upper region and a lower region, the heating signal XHITB_U may indicate repair address information of the upper region, and the other heating signal XHIT_D may indicate repair address information of the lower region. The heating signals (XHITB_U, XHIT_D) may be changed in logic level in response to the cutting information of the fuse array.

For example, the repair address controller 221 may output a high-level signal when the heating signals (XHITB_U, XHIT_D) and the repair enable signal RXEN are activated. For example, the repair address controller 221 may output a low-level signal when the heating signals (XHITB_U, XHIT_D) are deactivated on the condition that the repair enable signal RXEN is activated.

The repair address controller 221 may include logic gates, for example, NAND gates (ND2, ND3). The NAND gate ND2 may perform a logic NAND operation between the heating signal XHITB_U and the other heating signal XHIT_D. The NAND gate ND3 may perform a logic NAND operation between the output signal of the NAND gate ND2 and the repair enable signal RXEN.

The normal address controller 222 may combine the address LAX345, the normal enable signal NXEN, the refresh address SLAX345, and the enable signal EN, and may thus output the combined resultant signal.

For example, during the normal active mode, the normal address controller 222 may combine the address LAX345 and the normal enable signal NXEN, and may thus output the combined resultant signal. During the smart refresh mode, the normal address controller 222 may combine the refresh address SLAX345 and the enable signal EN, and may thus output the combined resultant signal. In this case, for example, the repair enable signal RXEN and the normal enable signal NXEN may be activated in a complementary manner.

The normal address controller 222 may include logic gates, for example, NAND gates (ND4, ND5) and an OR gate OR. In this case, for example, the NAND gate ND4 may perform a logic NAND operation between the address LAX345 and the normal enable signal NXEN. The NAND gate ND5 may perform a logic NAND operation between the refresh address SLAX345 and the enable signal EN. In addition, for example, the OR gate OR may perform an OR operation between the output signals of the NAND gates (ND4, ND5).

The combination circuit 223 may output the address control signal RLAX345 by combining the output signal of the repair address controller 221 and the output signal of the normal address controller 222. The combination unit 223 may include a logic gate or gates, for example, a NAND gate ND6. The NAND gate ND6 may perform a logic NAND operation between the output signal of the repair address controller 221 and the output signal of the normal address controller 222, and may thus output the address control signal RLAX345.

Figure 7:
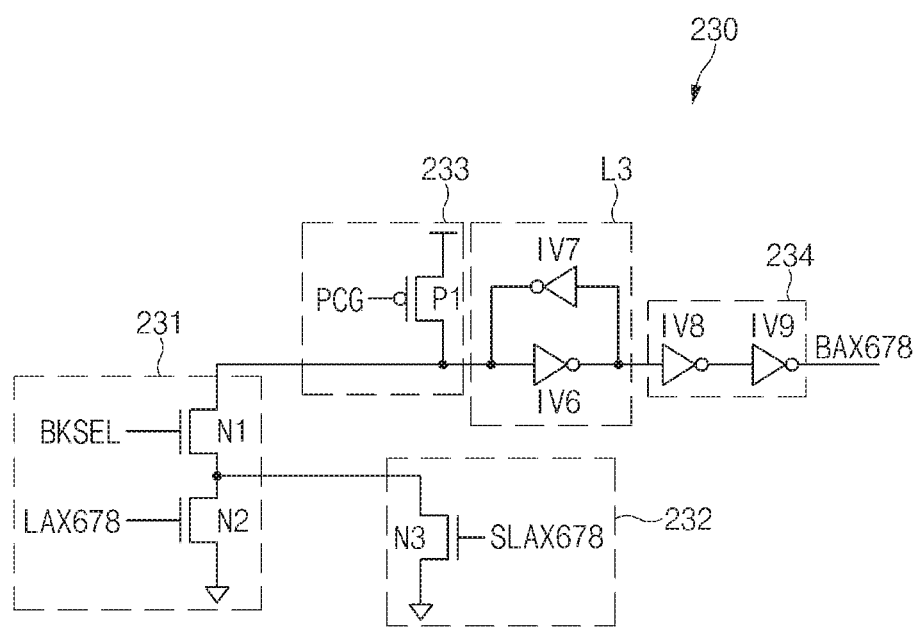

FIG. 7 is a circuit diagram illustrating a representation of an example of the address controller 230 illustrated in FIG. 4.

Referring to FIG. 7, the address controller 230 may output the address control signal BAX678, upon receiving the refresh address SLAX678, the precharge signal PCG, the bank selection signal BKSEL, and the address LAX678.

The address controller 230 may include address input circuits (231, 232), a precharge circuit 233, a latch circuit L3, and a delay circuit 234.

The address input circuit 231 may receive the address LAX678 in response to the bank selection signal BKSEL. The address input circuit 231 may include NMOS transistors (N1, N2).

The NMOS transistors (N1, N2) may be coupled in series between the precharge circuit 233 and a ground voltage terminal. The NMOS transistor N1 may receive the bank selection signal BKSEL through a gate terminal thereof, and the NMOS transistor N2 may receive the refresh address SLAX678 through a gate terminal thereof.

The address input circuit 232 may include an NMOS transistor N3. The NMOS transistor N3 may be coupled in parallel to the NMOS transistor N2, and may receive the refresh address SLAX678 through a gate terminal thereof.

The bank selection signal BKSEL may be activated during the active operation. The NMOS transistor N2 of the address input circuit 231 and the NMOS transistor N3 of the address input circuit 232 may operate in a complementary manner. For example, assuming that the address LAX678 is activated during the normal operation or the normal refresh operation, the NMOS transistors (N1, N2) are turned on such that the address control signal BAX678 is output at a high level. In this case, for example, the address input circuit 232 may remain off.

Assuming, for example, that the refresh address SLAX678 is activated during the smart refresh operation, the NMOS transistors (N1, N3) are turned on such that the address control signal BAX678 is output at a high level. In this case, for example, the NMOS transistor N2 of the address input circuit 231 may remain off.

The precharge circuit 233 may precharge the input terminal of the latch circuit L3 in response to the precharge signal PCG. The precharge circuit 233 may include a PMOS transistor P1. The PMOS transistor P1 may be coupled between a power-supply voltage terminal and the address input circuit 231, such that the PMOS transistor P1 may receive the precharge signal PCG through a gate terminal thereof.

The latch circuit L3 may latch the output signals of the address input circuits (231, 232). The latch circuit L3 may include inverters (IV6, IV7), I/O terminals of which are coupled to each other.

The delay circuit 234 may output the address control signal BAX678 by delaying the output signal of the latch L3. The delay circuit 234 may include inverters (IV8, IV9) configured to perform non-inversion delaying of the output signal of the latch L3.

Figure 8:
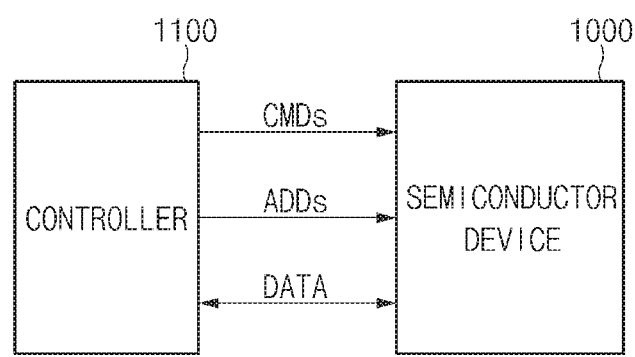
FIG. 8 is a block diagram illustrating a representation of an example of a system including a semiconductor device according to an embodiment of the present disclosure.

FIG. 8 is a block diagram illustrating a representation of an example of a system including a semiconductor device according to an embodiment of the present disclosure.

Referring to FIG. 8, a memory system may include a semiconductor device 1000 and a controller 1100. The controller 1100 may control the semiconductor device 1000 by applying commands (CMDs) and addresses (ADDs) to the semiconductor device 1000. The controller 1100 may transmit and receive data (DATA) to and from the semiconductor device 1000 during the read or write operation.

The controller 1100 may transmit the command signals (CMDs), such that an active command ACT, a precharge command PCG, a refresh command REF, a self-refresh entry command, a self-refresh termination command, etc. may be input to the semiconductor device 1000.

The controller 1100 may transmit the addresses (ADDs) for selecting a cell block and a word line to be activated in the semiconductor device 1000 configured to transmit the active command ACT. The controller 1100 may periodically transmit the refresh command REF to the controller 1100, and may transmit the self-refresh entry command and the self-refresh termination command to control the self-refresh mode of the semiconductor device 1000.

In this case, for example, the semiconductor device 1000 may include any of the memory devices illustrated in FIGS. 2 to 7. The semiconductor device 1000 may detect an address of a high-level active word line. The semiconductor device 1000 may detect and store the address of the high-level active word line, and may generate a target address. Whenever the refresh operation is performed a predetermined number of times during the normal refresh operation, the semiconductor device 1000 may perform the target refresh operation using the target address.

For example, when the semiconductor device 1000 enters the self-refresh mode, the semiconductor device 1000 may periodically perform the refresh operation without receiving the refresh command REF from the controller 1100.

For reference, the structure and operations needed for the semiconductor device 1000 configured to perform a plurality of refresh operations are identical to those of FIGS. 2 to 7. In response to a single bank during the smart refresh operation, the system including the semiconductor device 1000 may simultaneously refresh a plurality of word lines located at different positions according to respective groups Q1~Q4.

As is apparent from the above description, the refresh control device and the semiconductor device including the same according to embodiments of the present disclosure can properly cope with occurrence of failed parts caused by the row hammer phenomenon, and can perform a refresh function several times without guaranteeing an additional refresh time.

Those skilled in the art will appreciate that the various embodiments may be carried out in other specific ways than those set forth herein without departing from the spirit and essential characteristics of the disclosure. The above embodiments are therefore to be construed in all aspects as illustrative and not restrictive. The scope of the description should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A refresh control device comprising:
    an enable signal generator configured to generate an enable signal for performing a smart refresh operation; and
    a plurality of active controllers configured to generate a plurality of refresh signals for refreshing word lines located at different positions within one bank, based on receiving the enable signal,
    wherein the enable signal generator is configured to generate the enable signal by performing a logic operation between a smart refresh signal and a normal enable signal, and
    wherein the enable signal is activated when the smart refresh signal and the normal enable signal are activated.

2. The refresh control device according to claim 1, wherein each of the plurality of active controllers includes:
    an address latch circuit configured to store an address corresponding to a word line to be activated based on a smart refresh signal and an active signal, on a basis of each group of word lines for the one bank, and output a first refresh address and a second refresh address;
    a first address controller configured to output a first address control signal, based on receiving the first refresh address, at least one heating signal, a repair enable signal, a first address, a normal enable signal, and the enable signal;
    a second address controller configured to output a second address control signal, based on receiving the second refresh address, a precharge signal, a bank selection signal, and a second address; and
    a row decoder configured to output a refresh signal by decoding the first address control signal and the second address control signal.

3. The refresh control device according to claim 2, wherein the address latch circuit includes:

a first latch circuit configured to latch the first address based on activation of the active signal, and output the first refresh address based on activation of the smart refresh signal; and a second latch circuit configured to latch the second address based on activation of the active signal, and output the second refresh address based on activation of the smart refresh signal.

4. The refresh control device according to claim 3, wherein the first latch circuit includes:

a first transfer gate configured to selectively output the first address based on the active signal;

a first latch configured to latch an output signal of the first transfer gate; and a second transfer gate configured to output an output signal of the first latch as the first refresh address based on the smart refresh signal.

5. The refresh control device according to claim 3, wherein the second latch circuit includes:

a third transfer gate configured to selectively output the second address based on the active signal;

a second latch configured to latch an output signal of the third transfer gate; and a fourth transfer gate configured to output an output signal of the second latch as the second refresh address based on the smart refresh signal.

6. The refresh control device according to claim 2, wherein the first address controller includes:

a repair address controller configured to combine the heating signal and the repair enable signal during a repair mode, and output a combined result;

a normal address controller configured to combine the first refresh address, the first address, the normal enable signal, and the enable signal during a normal active mode or a smart refresh mode; and a combination circuit configured to output the first address control signal by combining an output signal of the repair address controller and an output signal of the normal address controller.

7. The refresh control device according to claim 6, wherein the repair address controller includes:

a first NAND gate configured to combine the heating signals; and a second NAND gate configured to combine an output signal of the first NAND gate and the repair enable signal.

8. The refresh control device according to claim 6, wherein the repair enable signal and the normal enable signal are activated in a complementary manner.

9. The refresh control device according to claim 6, wherein the normal address controller includes:

a third NAND gate configured to perform a logic NAND operation between the first address and the normal enable signal;

a fourth NAND gate configured to perform a logic NAND operation between the first refresh address signal and the enable signal; and an OR gate configured to output the first address control signal by performing a logic OR operation between an output signal of the third NAND gate and an output signal of the fourth NAND gate.

10. The refresh control device according to claim 6, wherein the combination circuit includes:

a fifth NAND gate configured to output the first address control signal by performing a logic NAND operation between the output signal of the repair address controller and the output signal of the normal address controller.

11. The refresh control device according to claim 2, wherein the second address controller includes:

a first address input circuit configured to receive the bank selection signal and the second address during a normal active mode, thereby controlling a logic level of a first node;

a second address input circuit configured to receive the second refresh address during a smart refresh mode, thereby controlling a logic level of the first node;

a precharge circuit configured to precharge the first node by the precharge signal;

a third latch circuit configured to latch a signal of the first node; and a delay circuit configured to output the second address control signal by delaying an output signal of the third latch circuit.

12. The refresh control device according to claim 11, wherein the first address input circuit includes:

a first transistor, a turn-on operation of which is controlled by the bank selection signal; and a second transistor coupled between a first transistor and a ground voltage in a manner that a turn-on operation of the second transistor is controlled by the second address.

13. The refresh control device according to claim 12, wherein the second address input circuit includes:

a third transistor coupled between the first address input circuit and a ground voltage, and configured to receive the second refresh address through a gate terminal of the third transistor, wherein the second transistor and the third transistor are operated in a complementary manner.

14. A semiconductor device comprising:

a bank including a plurality of groups divided on a basis of a specific unit in a manner that word lines of different addresses classified according to respective groups are refreshed based on a refresh signal; and a refresh controller configured to generate an enable signal during a smart refresh mode, and the refresh signal for performing a smart refresh operation on a basis of the plurality of groups based on a refresh address, wherein the refresh controller includes:

an enable signal generator configured to generate the enable signal; and a plurality of active controllers configured to generate a plurality of refresh signals for refreshing word lines located at different positions according to the plurality of groups, based on receiving the enable signal, wherein the enable signal generator is configured to generate the enable signal by performing a logic operation between a smart refresh signal and a normal enable signal, and wherein the enable signal is activated when the smart refresh signal and the normal enable signal are activated.

15. The semiconductor device according to claim 14, wherein the refresh controller is located in an X-hole region disposed between respective banks.

16. The semiconductor device according to claim 14, wherein the enable signal generator is utilized by a plurality of banks.

17. The semiconductor device according to claim 14, wherein the number of the plurality of active controllers is identical to the number of the plurality of groups.

18. The semiconductor device according to claim 14, wherein each of the plurality of active controllers includes:
- an address latch circuit configured to store an address corresponding to a word line to be activated based on a smart refresh signal and an active signal, on a basis of each of the groups, and output a first refresh address and a second refresh address;
- a first address controller configured to output a first address control signal, based on receiving the first refresh address, at least one heating signal, a repair enable signal, a first address, a normal enable signal, and the enable signal;
- a second address controller configured to output a second address control signal, based on receiving the second refresh address, a precharge signal, a bank selection signal, and a second address; and
- a row decoder configured to output a refresh signal by decoding the first address control signal and the second address control signal.

* * * * *